United States Patent
Winoto

(10) Patent No.: US 9,225,361 B2
(45) Date of Patent: Dec. 29, 2015

(54) FREQUENCY PLANNING FOR DIGITAL POWER AMPLIFIER

(71) Applicant: Marvell World Trade Ltd., St. Michael (BB)

(72) Inventor: Renaldi Winoto, Danville, CA (US)

(73) Assignee: Marvell World Trade Ltd., St. Michael (BB)

(*) Notice: Subject to any disclaimer, the term of this patent is extended or adjusted under 35 U.S.C. 154(b) by 0 days.

(21) Appl. No.: 14/559,522

(22) Filed: Dec. 3, 2014

(65) Prior Publication Data

US 2015/0155893 A1 Jun. 4, 2015

Related U.S. Application Data

(60) Provisional application No. 61/911,725, filed on Dec. 4, 2013.

(51) Int. Cl.
*H04B 1/04* (2006.01)
*H03F 3/217* (2006.01)

(52) U.S. Cl.
CPC .............. *H04B 1/04* (2013.01); *H03F 3/2175* (2013.01); *H04B 1/0458* (2013.01); *H04B 2001/0408* (2013.01)

(58) Field of Classification Search
CPC .................. H04B 1/04; H04B 1/0458; H04B 2001/0408; H03F 3/2175
USPC .............................. 375/296; 455/114.2, 114.3
See application file for complete search history.

(56) References Cited

U.S. PATENT DOCUMENTS

| | | | |
|---|---|---|---|
| 7,761,068 B2 | 7/2010 | Rezeq | |
| 7,826,554 B2 | 11/2010 | Haque | |
| 7,936,229 B2 | 5/2011 | Akhtar | |
| 8,035,446 B1 | 10/2011 | Chi | |
| 8,638,168 B1 | 1/2014 | Signoff | |
| 8,681,894 B2 | 3/2014 | Mu | |
| 8,699,620 B1 | 4/2014 | Wu | |
| 2006/0038710 A1* | 2/2006 | Staszewski et al. | 341/143 |
| 2009/0004981 A1 | 1/2009 | Eliezer | |
| 2010/0091688 A1 | 4/2010 | Staszewski | |
| 2014/0177755 A1* | 6/2014 | Lu et al. | 375/297 |

FOREIGN PATENT DOCUMENTS

WO       WO0289322 A8       3/2005

OTHER PUBLICATIONS

International Application No. PCT/IB2014/002647, Notification of Transmittal of the International Search Report and the Written Opinion of the International Searching Authority, mailed Mar. 13, 2015, 8 pages.

* cited by examiner

*Primary Examiner* — Vineeta Panwalkar

(57) ABSTRACT

Systems and techniques relating to wireless communication devices and digital power amplifiers include, according to an aspect, a device including: modulation circuitry of a radio frequency transmitter having a local oscillator frequency; a digital power amplifier coupled with the modulation circuitry; and a clock input coupled with the digital power amplifier; wherein the clock input provides a clock signal to the digital amplifier at a sampling clock frequency; and wherein the local oscillator frequency is an integer multiple of the sampling clock frequency.

20 Claims, 4 Drawing Sheets $f_{CLK} = (1/N) \cdot f_{LO}$ $f_{CLK} = 1/2 \cdot f_{LO}$

FREQUENCY PLANNING FOR DIGITAL POWER AMPLIFIER

CROSS REFERENCE TO RELATED APPLICATION

This disclosure claims the benefit of the priority of U.S. Provisional Application Ser. No. 61/911,725, filed Dec. 4, 2013, entitled, "FREQUENCY PLANNING FOR DIGITAL POWER AMPLIFIER", which is incorporated herein by reference in its entirety.

BACKGROUND

This disclosure relates to wireless communication devices and circuitry used therein.

Wireless communication devices typically use power amplifiers to amplify signals prior to over the air transmission. The efficiency of a power amplifier generally impacts the performance of devices such as a mobile phone or a base station. For a mobile phone, a higher efficiency power amplifier can increase battery life. For a base station, a higher efficiency power amplifier can reduce power consumption, which results in lower operating costs. However, in addition to efficiency, the cost of production can also be important.

Digital Power Amplifier (DPA) technology is a promising power amplifier architecture for wireless communication devices that use one or more wireless communication technologies, such as wireless local area network (WLAN) technologies, such as defined in one or more wireless standards, e.g., IEEE (Institute of Electrical and Electronics Engineers) 802.11 standards. Various examples of wireless communication devices include mobile phones, smart phones, wireless routers, wireless hubs, base stations, and access points. In some cases, wireless communication electronics are integrated with data processing equipment such as laptops, personal digital assistants, and desktop computers.

SUMMARY

The present disclosure includes systems and techniques related to wireless communication devices and digital power amplifiers. A Digital Power Amplifier (DPA) can yield higher efficiency and reduce the amount of analog signal processing used in a transmitter signal chain in a wireless communication device. The systems and techniques described herein can facilitate the use of DPAs in wireless communication devices.

According to an aspect of the described systems and techniques, a device includes modulation circuitry of a radio frequency transmitter having a local oscillator frequency; a digital power amplifier coupled with the modulation circuitry; and a clock input coupled with the digital power amplifier; wherein the clock input provides a clock signal to the digital amplifier at a sampling clock frequency; and wherein the local oscillator frequency is an integer multiple of the sampling clock frequency.

The local oscillator frequency can be equal to the sampling clock frequency. The device can include one or more antennas. The digital power amplifier can be coupled directly to the one or more antennas, the local oscillator frequency can be two times the sampling clock frequency, and the device can be a wireless communications device configured to transmit a 5 GHz WiFi signal using the modulation circuitry, the digital power amplifier, and the one or more antennas. Moreover, the device can include an anti-alias filter coupled between the digital power amplifier and the one or more antennas, wherein the anti-alias filter is designed to filter out one or more alias signals in accordance with the local oscillator frequency and the sampling clock frequency.

The device can be a System on Chip (SoC) including: processor electronics; transceiver electronics coupled with the processor electronics; and a single clock source that distributes a common clock signal to at least one processing unit of the processor electronics and to the clock input of the digital power amplifier. The digital power amplifier can be a Polar digital power amplifier. The digital power amplifier can be an IQ/Cartesian digital power amplifier.

According to another aspect, a method includes upconverting a baseband signal using a carrier frequency for wireless transmission to generate a transmission signal; feeding the transmission signal to multiple, respective segments of a digital power amplifier; sampling the transmission signal in selected ones of the segments of the digital power amplifier using a clock frequency that is harmonized with the carrier frequency; amplifying the sampled transmission signal in the selected ones of the segments of the digital power amplifier to generate amplified output signals; and combining the amplified output signals for radio frequency transmission.

The sampling can include sampling using a clock frequency that is equal to the carrier frequency. The method can include generating the baseband signal in accordance with a wireless communication standard; and transmitting the combined output signals using an antenna in accordance with the wireless communication standard. In addition, the method can include feeding the combined output signals directly to the antenna, using circuit parasitics to effect filtering of alias signals out of the combined output signals before transmission.

The sampling can include sampling using a clock frequency that is one half of the carrier frequency. The wireless communication standard can be a 5 GHz WiFi standard. The method can include filtering alias signals out of the combined output signals before transmission using an anti-alias filter designed in accordance with the clock frequency and the carrier frequency.

The method can include distributing a single clock signal to both (i) a baseband processing unit for generating the baseband signal and (ii) the digital power amplifier for the sampling. The method can include phase modulating the transmission signal before feeding the transmission signal to the multiple, respective segments of the digital power amplifier. Further, the feeding can include feeding the transmission signal to separate I and Q banks of the digital power amplifier.

The described systems and techniques can be implemented in electronic circuitry, computer hardware, firmware, software, or in combinations of them, such as the structural means disclosed in this specification and structural equivalents thereof. For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

The described systems and techniques can result in one or more of the following advantages. Wireless communication devices can utilize high efficiency switching power amplifiers to significantly reduce the amount of analog signal processing required in a transmitter. The clock frequency used by a Digital Power Amplifier (DPA) can be harmonized with a local oscillator frequency used for wireless transmission, and a DPA can be built that scales well with CMOS (Complimentary-Metal-Oxide-Semiconductor) technology, which can result in smaller circuitry area and potentially smaller wireless communication devices.

In some implementations, clock distribution can be simplified. A single clock domain can be used in a transmitter, with no need to generate a separate clock for sampling in a DPA, and no spurious signals of a separate sampling clock frequency need be generated at the power amplifier output. Moreover, in some implementations, frequency separation between a desired signal and alias signals can be guaranteed to be large enough that the parasitic response of the circuit components of a transmitter can be used to effectively filter out the alias signals, without requiring an explicitly anti-alias filter for the DPA.

Details of one or more implementations are set forth in the accompanying drawings and the description below. Other features and advantages may be apparent from the description and drawings, and from the claims.

BRIEF DESCRIPTION OF THE DRAWINGS

Like reference symbols in the various drawings indicate like elements.

DETAILED DESCRIPTION

Figure 1A:
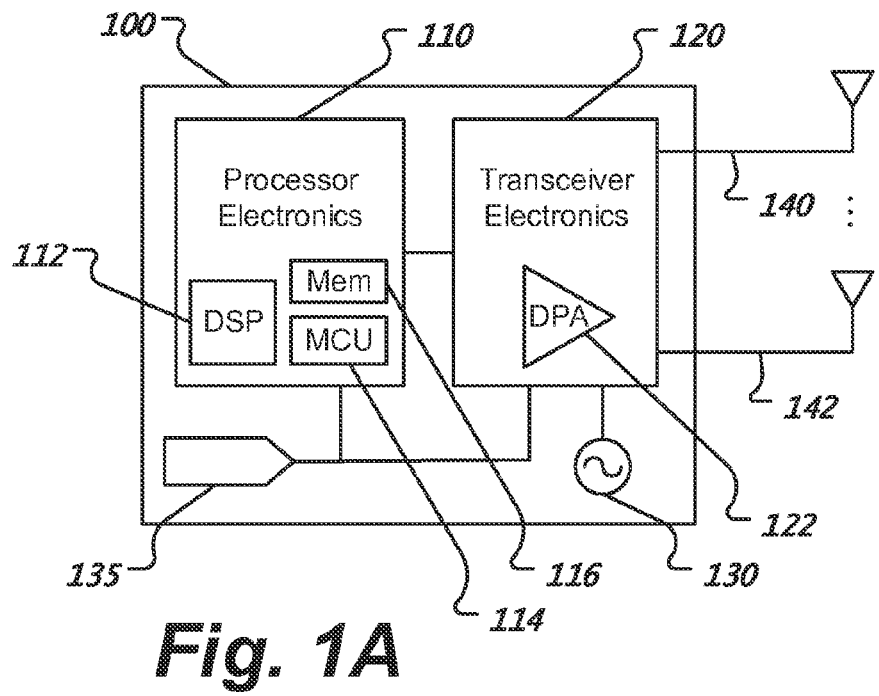
FIG. 1A shows an example of a wireless communication device architecture.

This disclosure provides details and examples of technologies for wireless communications, including frequency planning for digital power amplifiers. FIG. 1A shows an example of a wireless communication device architecture. A wireless communication device 100 can communicate with one or more other wireless communication devices using one or more antennas 140, 142 and one or more wireless communication technologies (e.g., over a wireless network). The device 100 can be a System on Chip (SoC), which includes one or more integrated circuit (IC) devices. The device 100 can be multiple IC devices coupled with each other on a common circuit board. In some implementations, the device 100 can be an electronic device, such as an access point (AP), base station (BS), wireless headset, access terminal (AT), client station, or mobile station (MS).

The wireless technologies employed can include near field communications (NFC), Bluetooth (BT), WiFi, as well as mobile phone technologies, such as WCDMA (Wideband Code Division Multiple Access), CDMA2000, UMTS (Universal Mobile Telecommunications System), GSM (Global System for Mobile communications), High Speed Packet Access (HSPA), and LTE (Long-Term Evolution, often referred to as 4G). The antennas 140, 142 can include an antenna that is shared by different wireless technologies, one or more antennas that are dedicated to a particular wireless technology, and/or two or more antennas used for a particular wireless technology. For example, in some implementations, a set of antennas 140, 142 can be used for multiple input multiple output (MIMO) communications. In addition, the other wireless device(s) with which the device 100 communicates wirelessly can use the same or different device architecture as device 100.

The wireless communication device 100 includes circuitry that can be understood in two main parts: transceiver electronics 120 to send and receive wireless signals over one or more antennas 140, 142; and processor electronics 110 to effect the wireless communications using the transceiver electronics 120. In some implementations, the device 100 includes dedicated circuitry for transmitting and dedicated circuitry for receiving. In addition, the processor electronics 110 can include one or more processors, such as a digital baseband processor and one or more additional dedicated processing units (e.g., a power management unit and audio codec). In some implementations, the processor electronics include at least one Digital Signal Processor (DSP) 112, at least one MicroController Unit (MCU) 114, and at least one memory (Mem) device 116 to hold data and potentially instructions for the MCU 114. Many variations on the details of the architecture of the processor electronics are possible.

In some implementations, transceiver electronics 120 include integrated transmitting and receiving circuitry. Thus, it will be appreciated that the two main parts of the device 100 are shown in FIG. 1A for ease of understanding, and such an explicit separation of components is not required. The device 100 includes modulation circuitry, e.g., in the transceiver electronics 120, which is driven by a local oscillator 130, which can correspond to a carrier frequency for the wireless communications. The transceiver electronics 120 can up-convert a baseband analog signal, and then amplify the signal using a Digital Power Amplifier (DPA) 122 before transmission on one or more antennas 140, 142. The DPA 122 is shown as part of the transceiver electronics 120, but it will be appreciated that the DPA 122 can also be viewed as separate from the transceiver electronics.

The DPA 122 has a clock source 135, which can be shared with the processor electronics 110, as shown. In some implementations, a single clock is distributed to and used by both the processor electronics 120 and the DPA 122. Thus, a transmitter can be designed with only a single clock, which can simplify clock distribution in the system. In some implementations, the clock signal from source 135 can be down sampled before use by the DPA 122. In some implementations, the DPA 122 can have its own dedicated clock source 135. In any case, the frequency of the clock (CLK) signal used by the DPA 122 can be harmonized with the frequency of the local oscillator (LO) signal generated by the oscillator 130.

A DPA is a sampled-data domain system, which means the device architecture needs to deal with the problem of aliasing. This issue is similar to that which arises when putting a Digital to Analog Converter (DAC) directly at the antenna. DPAs typically suffer from high out-of-band emission due to unfiltered aliases. For example, if the DPA uses digital inputs sampled at 1 gigahertz (GHz), an alias signal will be created every 1 GHz, i.e., at 1 GHz, 2 GHz, 3 GHz, 4 GHz, etc. This can have significant detrimental impact when the DPA is connected directly to an antenna, without intermediate filtering, since the signal images or aliases that are generated by the sampling process will get directly transmitted to the antenna and create emission issues, whether regulatory or standards based emission issues.

A filter can be placed at the output of the DPA in order to eliminate those aliases, but this usually comes at a price of efficiency, added component cost, or both. In some cases, it can be too expensive to put anti-alias rejection filter(s) at the power amplifier output. Moreover, using an anti-alias filter can cause insertion loss that can directly degrade power amplification efficiency.

In addition, aliases of the DPA signal can interact with harmonics of the carrier frequency, LO, especially in the case of odd harmonics. Note that the LO frequency signal is also put through digital logic circuits in a DPA, and so all-order harmonics of the LO frequency are also generated and interact with the clock frequency of the sampled data system. Aliases can occur at $k*f_{LO} \pm m*f_{CLK}$ for arbitrary k and m, where m is any integer and k is usually just odd multiples of the LO frequency. Some combination of k and m can result in an alias signal that is very close to the operating/carrier frequency, and such an alias signal can be very difficult to filter out. Note that the emission level should be sufficiently low to meet regulatory requirements. For example, if $f_{CLK}$ is 1 GHz, and $f_{LO}$ is 2.4 GHz, the third order harmonic of the clock ($3*f_{CLK}$) will generate an alias at 3 GHz (600 MHz away from $f_{LO}$), three times $f_{LO}$ minus five times $f_{CLK}$ will result in an alias at 2.2 GHz (200 MHz away from $f_{LO}$), etc. Note that for a conventional DAC, the closest alias is typically 1 GHz away.

Figure 1B:
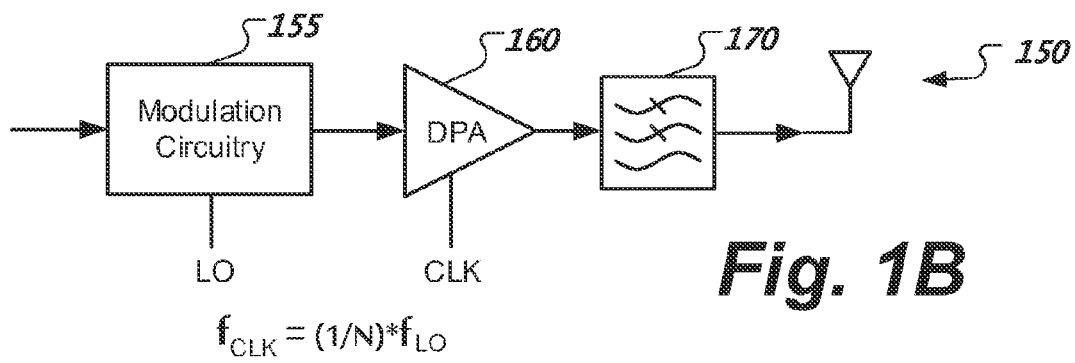
FIGS. 1B and 1C show further details of examples of wireless communication device architectures.

FIG. 1B shows further details of an example 150 of a wireless communication device architecture. Modulation circuitry 155 generates an output signal for transmission using an LO signal having an LO frequency, and DPA 160 amplifies this output signal for transmission using a CLK input to sample the output signal of the modulation circuitry 155 at the CLK frequency. In some implementations, the CLK frequency and the LO frequency can be set equal to each other. This guarantees that the interaction of aliases and carrier harmonics result in emissions that are integer multiples of the LO frequency, which can be high enough (e.g., 2-3 GHz) to make the alias signals far enough away from the desired frequency of the transmission to make them relatively easy to filter out.

In the example 150 of FIG. 1B, an anti-alias filter 170 is placed between the DPA 160 and the antenna. Because the closest alias will be $f_{LO}$ away from the signal of interest, due to the choice of the CLK frequency and the LO frequency, it is easier to filter at Radio Frequency (RF) because the frequency spacing is large, and the filter 170 need not have a very sharp filter response. Thus, the anti-alias filter 170 can be implemented using less circuit elements, at lower cost, or both, and it can be simpler to filter out the alias signals to meet emission requirements. Note that the spurious signals created by this architecture for the DPA are multiples of LO, which are usually already present in a transmitter due to other circuit components, and so this DPA architecture does not introduce anything significant to degrade the system.

In general, the CLK frequency can be harmonized with the LO frequency in accordance with the equation $f_{CLK}=(1/N)*f_{LO}$. This can guarantee frequency separation of $(1/N)*f_{LO}$, and the positive integer N can be selected in accordance with the specific implementation (e.g., N=1, 2, 3, 4, 5, 6, 7, 8, 9, 10, etc.) to avoid overlap in alias signal(s) and the desired signal and thus reduce the need for filtering. Moreover, in some implementations, N can be selected to avoid filtering altogether, and the guaranteed frequency separation can allow removal of the anti-alias filter 170 entirely.

Figure 1C:
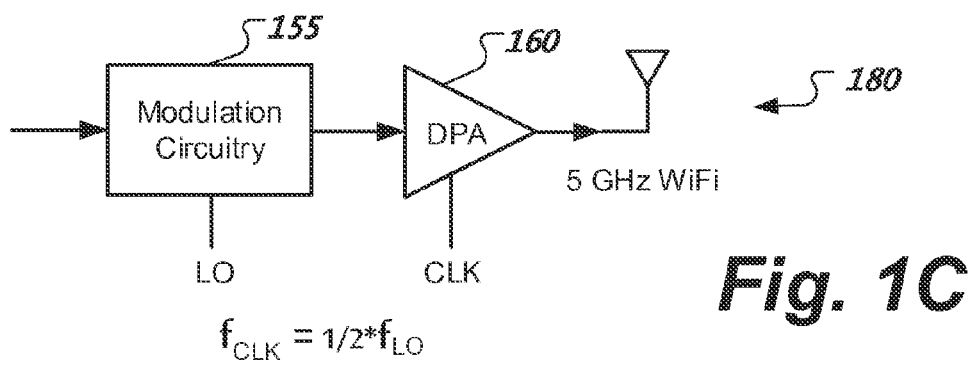

FIG. 1C shows details of another example 180 of a wireless communication device architecture, where no anti-alias filter 170 is included, and the DPA 160 is directly connected with the antenna. In some implementations, the parasitic frequency response of the front-end components (components of the transceiver electronics 120, such as matching diplexer, etc.) can be sufficient to bring the emission level to an acceptable level. The parasitic response of the circuitry can act as an implicit out-of-band filter, which can be used to remove the alias signals from the DPA that are guaranteed to be sufficiently far enough away from the signal of interest to be effectively removed by the circuit parasitics. Thus, in some implementations, the DPA 160 can be connected directly with the antenna(s).

In the example 180 of FIG. 1C, the CLK frequency can be harmonized with the LO frequency in accordance with the equation $f_{CLK}=1/2*f_{LO}$. Alias signals will thus occur at every ½ multiple of LO, but they are still harmonically related, so there will be no interaction signals created at frequencies that are closer than ½ LO. This approach of setting the harmonization integer in combination with using circuit parasitic response to eliminate the need for an explicit anti-alias filter can be used with various wireless communication technologies at various transmission frequencies. For example, the example 180 can be implemented to generate a 5 GHz WiFi signal.

Figure 2A:
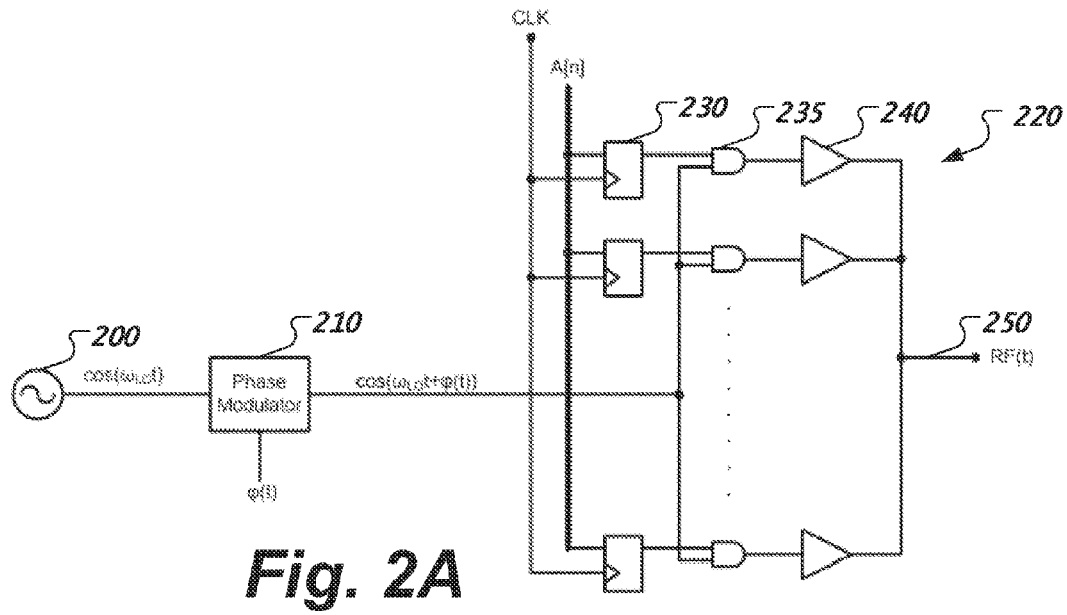
FIG. 2A shows an example of a Polar DPA.

The DPAs 122, 160 can be selected from DPAs of various types, such as a Polar DPA or an IQ/Cartesian DPA. FIG. 2A shows an example of a Polar DPA, which works in amplitude and phase. An oscillator 200 generates an input signal, cos($\omega_{LO}t$), where $\omega_{LO}$ is the carrier frequency for the wireless standard being used. A phase modulator 210 modifies this signal using an input phase signal, $\phi(t)$, to generate the phase modulated carrier signal, cos($\omega_{LO}t+\phi(t)$), which is routed to each of multiple power amplifier segments 220 (note that a DPA is composed of unit power amplifiers rather than one big power amplifier). Each of the segments 220 includes a latch 230, an AND gate 235, and an amplifier circuit 240.

A digital amplitude signal, A[n], controls the number of amplifier segments that are turned on, and A[n] is sampled at the frequency of the clock signal, $f_{CLK}$. A set of AND gates 235 mix the phase modulated carrier signal, cos($\omega_{LO}t+\phi(t)$), with respective A[n] signals at the sampling rate, and a corresponding set of amplifier circuits 240 amplify the respective signals before they are combined at an output node 250 for Radio Frequency (RF) transmission, RF(t). As will be appreciated, the clock (CLK) frequency for the Polar DPA of FIG. 2A can be set as described above.

Figure 2B:
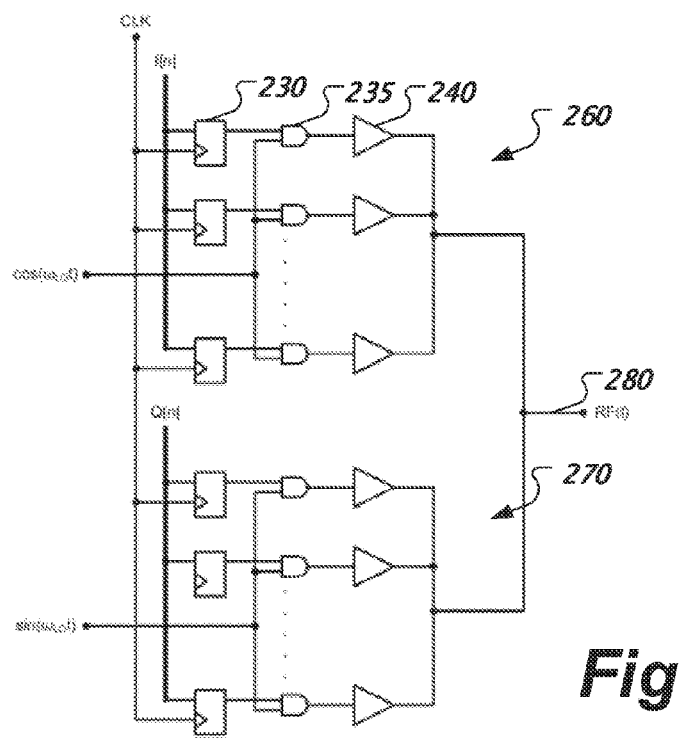
FIG. 2B shows an example of an IQ/Cartesian DPA.

FIG. 2B shows an example of an IQ/Cartesian DPA, which works in the real and imaginary (I and Q) axes. Again, there are multiple small unit amplifier segments, but in this implementation they are spit between an I bank 260 and a Q bank 270. The inputs to the IQ/Cartesian DPA include an in-phase carrier signal, cos($\omega_{LO}t$), a quadrature carrier signal, sin($\omega_{LO}t$), a digital in-phase signal, I[n], and a digital quadrature signal, Q[n]. Note that while the in-phase carrier signal and the quadrature carrier signal are out of phase with each other, they operate at the same frequency, $\omega_{LO}$.

Both I[n] and Q[n] are sampled at the frequency of the clock signal, $f_{CLK}$. The number of segments turned on in the I bank 260 is controlled by I[n], and the number of segments turned on the Q bank 270 is controlled by Q[n]. The outputs of each respective bank 260, 270 are combined together, and the respective output signals of the banks 260, 270 are combined at an output node 280 for RF transmission, RF(t). Once again, this is sampled data clocked by the CLK input. Thus, I[n] and Q[n] are latched at the frequency of the clock, and the clock (CLK) frequency for the IQ/Cartesian DPA of FIG. 2B can be set as described above.

Figure 3A:
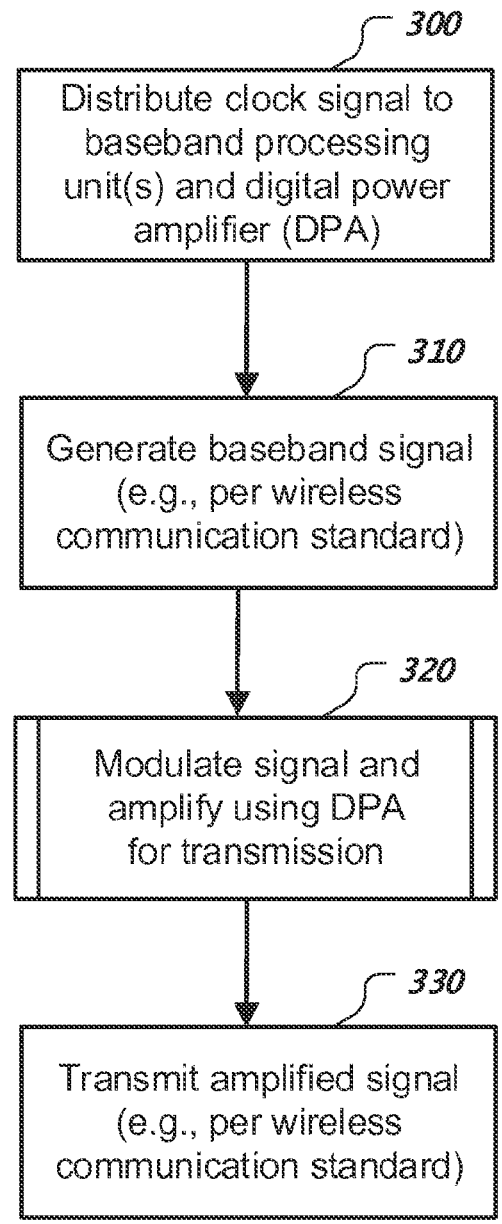
FIGS. 3A and 3B show examples of processes to operate a DPA for wireless transmissions.
Figure 3B:
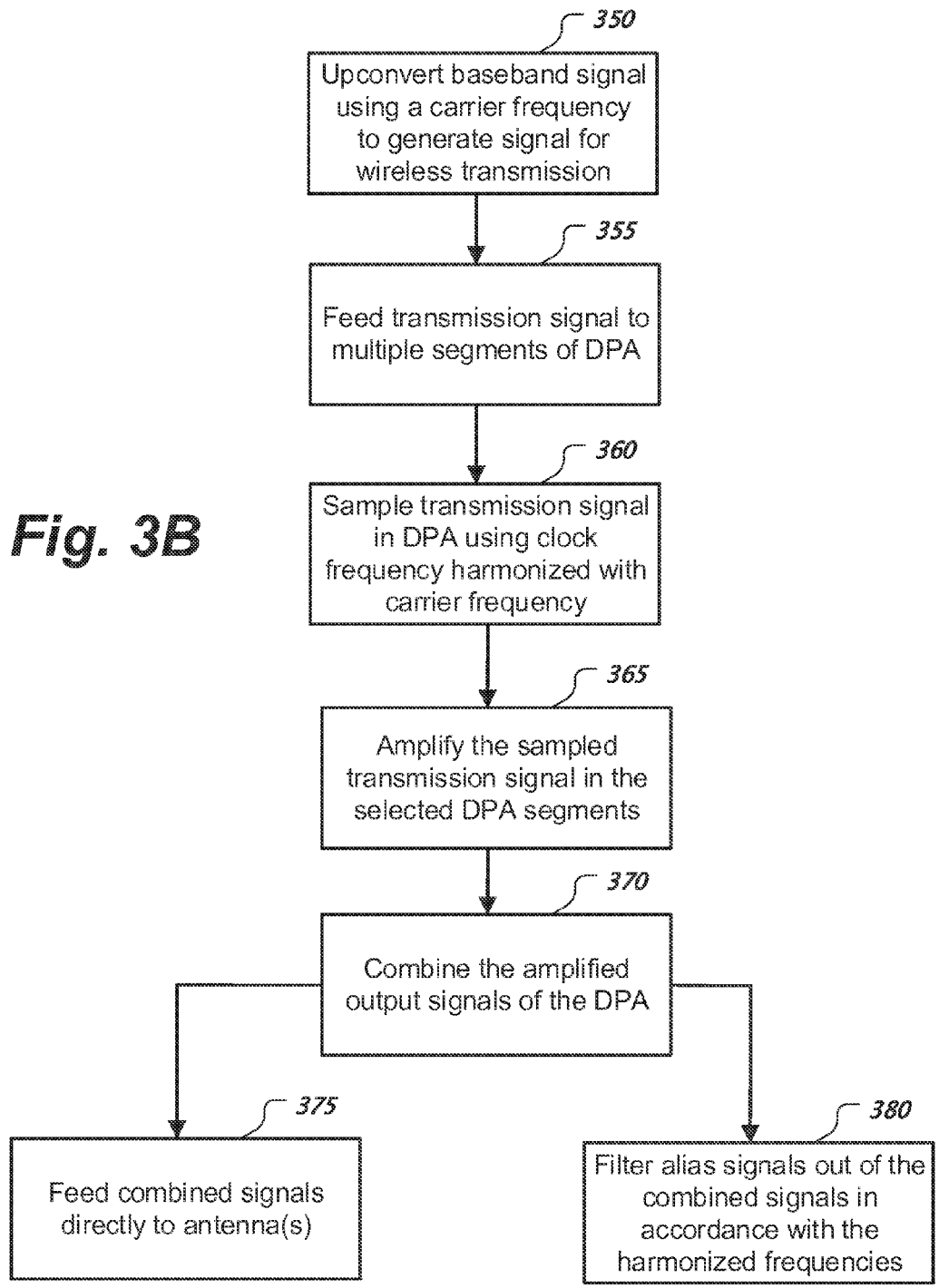

FIGS. 3A and 3B show examples of processes to operate a DPA for wireless transmissions. At 300, a single clock signal can be distributed to both one or more baseband processing units of a transmitter and a DPA of the transmitter. As noted above, use of a single clock source for both baseband processing and digital power amplification of an analog signal to be transmitted can simplify the architecture of a wireless transmitter. At 310, a baseband signal can be generated using the distributed clock signal. For example, the baseband signal can be generated in accordance with a wireless communication standard, such as an IEEE 802.11 standard.

At 320, the baseband signal is prepared for transmission using a DPA in accordance with the frequency planning architecture described herein. This can include modulating the baseband signal for transmission at a carrier frequency. Many different modulation systems and techniques can be used. In some implementations, the transmission signal is phase modulated before being fed to multiple segments of a Polar DPA. Other modulations are also possible. In any case, the clock frequency used by the DPA is harmonized with the carrier frequency, as described herein. At 330, the amplified signal can be transmitted using an antenna. In some implementations, this involves using more than one antenna in accordance with a wireless communication standard. In some implementations, the wireless communication standard is a 5 GHz WiFi standard.

FIG. 3B shows examples of the defined process 320 from FIG. 3A. At 350, a baseband signal can be upconverted using a carrier frequency for wireless transmission to generate a transmission signal. At 355, the transmission signal can be fed to multiple, respective segments of a digital power amplifier. For example, the transmission signal can be fed to segments 220 of the Polar DPA shown in FIG. 2A. As another example, the transmission signal can be fed to segments in respective I and Q banks 260, 270 of the IQ/Cartesian DPA shown in FIG. 2B.

At 360, the transmission signal can be sampled in selected (e.g., A[n] in FIG. 2A) ones of the segments of the digital power amplifier using a clock frequency that is harmonized with the carrier frequency. In some implementations, the frequencies are harmonized by setting the clock frequency equal to the carrier frequency. In some implementations, the frequencies are harmonized by setting the clock frequency to one half the carrier frequency. In general, the harmonization involves choosing frequencies that at least approximately satisfy the equation, $f_{CLK}=(1/N)*f_{LO}$, with N=1, 2, 3, 4, 5, 6, 7, 8, 9, 10, etc.

At 365, the sampled transmission signal can be amplified in the selected ones of the segments of the digital power amplifier to generate amplified output signals. For example, respective amplifier circuits 240 of selected segments 220 can amplify the sampled signals. At 370, the amplified output signals can be combined for radio frequency transmission. This can include more than one level of combining. For example, a first set of amplified signals can be combined in a first bank 260, and a second set of amplified signals can be combined in a second bank 270 of an IQ/Cartesian DPA, before these combined signals are then combined with each other at output node 280.

In some implementations, the combined output signals can be fed directly to one or more antennas at 375. As described above, the inherent parasitic response of circuitry in the transceiver electronics 120 can be used to effect filtering of alias signals. Based on the carrier frequency, the clock frequency for the DPA can be selected to guarantee a frequency separation between the alias signals and the carrier frequency that is inherently filtered by the front-end components of the transmitter. In other implementations, the combined output signals can be explicitly filtered at 380 using an anti-alias filter designed in accordance with the clock frequency and the carrier frequency. Due to the frequency separation between the alias signals and the carrier frequency guaranteed by the clock frequency selected in view of the carrier frequency and the device hardware, constraints on the frequency response for the anti-alias filter can be relaxed, thus simplifying the transmitter design and potentially reducing the size and/or cost of the device.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A device comprising:
    modulation circuitry of a radio frequency transmitter having a local oscillator frequency receivable on a local oscillator input from an oscillator source;
    a digital power amplifier coupled with the modulation circuitry; and
    a clock input coupled with the digital power amplifier, the clock input being separate from the local oscillator input, the clock input configured to couple with a clock source that is different from the oscillator source;
    wherein the clock input provides a clock signal to separate segments of the digital power amplifier at a sampling clock frequency; and
    wherein the local oscillator frequency is an integer multiple of the sampling clock frequency.

2. The device of claim 1, wherein the local oscillator frequency is equal to the sampling clock frequency.

3. The device of claim 1, comprising one or more antennas.

4. The device of claim 3, wherein the digital power amplifier is coupled directly to the one or more antennas.

5. The device of claim 4, wherein the local oscillator frequency is two times the sampling clock frequency.

6. The device of claim 5, wherein the device is a wireless communications device configured to transmit a 5 GHz WiFi signal using the modulation circuitry, the digital power amplifier, and the one or more antennas.

7. A device of claim 3, comprising:
    modulation circuitry of a radio frequency transmitter having a local oscillator frequency;
    a digital power amplifier coupled with the modulation circuitry;
    a clock input coupled with the digital power amplifier, wherein the clock input provides a clock signal to the digital power amplifier at a sampling clock frequency, and wherein the local oscillator frequency is an integer multiple of the sampling clock frequency;
    one or more antennas; and
    an anti-alias filter coupled between the digital power amplifier and the one or more antennas, wherein the anti-alias filter is designed to filter out one or more alias signals in accordance with the local oscillator frequency and the sampling clock frequency.

8. The device of claim 7, wherein the device is a System on Chip (SoC) comprising:
    processor electronics;
    transceiver electronics coupled with the processor electronics; and
    a single clock source that distributes a common clock signal to at least one processing unit of the processor electronics and to the clock input of the digital power amplifier.

9. The device of claim 7, wherein the digital power amplifier is a Polar digital power amplifier.

10. The device of claim 1, wherein the digital power amplifier is an IQ/Cartesian digital power amplifier.

11. A method comprising:
    upconverting a baseband signal using a carrier frequency for wireless transmission to generate a transmission signal;
    feeding the transmission signal to multiple, respective segments of a digital power amplifier;
    sampling the transmission signal in selected ones of the segments of the digital power amplifier using a clock frequency that is harmonized with the carrier frequency;
    amplifying the sampled transmission signal in the selected ones of the segments of the digital power amplifier to generate amplified output signals; and
    combining the amplified output signals for radio frequency transmission.

12. The method of claim 11, wherein the sampling comprises sampling using a clock frequency that is equal to the carrier frequency.

13. The method of claim 11, comprising:
    generating the baseband signal in accordance with a wireless communication standard; and
    transmitting the combined output signals using an antenna in accordance with the wireless communication standard.

14. The method of claim 13, comprising feeding the combined output signals directly to the antenna, using circuit parasitics to effect filtering of alias signals out of the combined output signals before transmission.

15. The method of claim 13, wherein the sampling comprises sampling using a clock frequency that is one half of the carrier frequency.

16. The method of claim 15, wherein the wireless communication standard is a 5 GHz WiFi standard.

17. The method of claim 11, comprising filtering alias signals out of the combined output signals before transmission using an anti-alias filter designed in accordance with the clock frequency and the carrier frequency.

18. The method of claim 11, comprising distributing a single clock signal to both (i) a baseband processing unit for generating the baseband signal and (ii) the digital power amplifier for the sampling.

19. The method of claim 11, comprising phase modulating the transmission signal before feeding the transmission signal to the multiple, respective segments of the digital power amplifier.

20. The method of claim 11, wherein the feeding comprises feeding the transmission signal to separate I and Q banks of the digital power amplifier.

* * * * *